United States Patent
Streefkerk et al.

(10) Patent No.: US 7,433,016 B2
(45) Date of Patent: Oct. 7, 2008

(54) LITHOGRAPHIC APPARATUS AND DEVICE MANUFACTURING METHOD

(75) Inventors: Bob Streefkerk, Tilburg (NL); Sjoerd Nicolaas Lambertus Donders, 's-Hertogenbosch (NL); Roelof Frederik De Graaf, Veldhoven (NL); Christiaan Alexander Hoogendam, Veldhoven (NL); Martinus Hendrikus Antonius Leenders, Rotterdam (NL); Jeroen Johannes Sophia Maria Mertens, Duizel (NL); Michel Riepen, Bergschenhoek (NL)

(73) Assignee: ASML Netherlands B.V., Veldhoven (NL)

( * ) Notice: Subject to any disclaimer, the term of this patent is extended or adjusted under 35 U.S.C. 154(b) by 165 days.

(21) Appl. No.: 11/120,176

(22) Filed: May 3, 2005

(65) Prior Publication Data
US 2006/0250590 A1    Nov. 9, 2006

(51) Int. Cl.
*G03B 27/42*    (2006.01)
*G03B 27/52*    (2006.01)
(52) U.S. Cl. .......................... 355/53; 355/30
(58) Field of Classification Search ............... 355/30, 355/50, 72–76, 53
See application file for complete search history.

(56) References Cited

U.S. PATENT DOCUMENTS

| | | | |
|---|---|---|---|
| 3,573,975 A | 4/1971 | Dhaka et al. ............. 117/212 |
| 3,648,587 A | 3/1972 | Stevens ..................... 95/44 |
| 4,346,164 A | 8/1982 | Tabarelli et al. ............. 430/311 |
| 4,390,273 A | 6/1983 | Loebach et al. ............. 355/125 |
| 4,396,705 A | 8/1983 | Akeyama et al. ............ 430/326 |
| 4,480,910 A | 11/1984 | Takanashi et al. ............. 355/30 |
| 4,509,852 A | 4/1985 | Tabarelli et al. ............. 355/30 |
| 5,040,020 A | 8/1991 | Rauschenbach et al. ....... 355/53 |
| 5,121,256 A | 6/1992 | Corle et al. ................. 359/664 |
| 5,610,683 A | 3/1997 | Takahashi ................... 355/53 |
| 5,825,043 A | 10/1998 | Suwa ......................... 250/548 |
| 5,900,354 A | 5/1999 | Batchelder .................. 430/395 |
| 6,191,429 B1 | 2/2001 | Suwa ......................... 250/548 |
| 6,236,634 B1 | 5/2001 | Lee et al. .................... 369/112 |
| 6,600,547 B2 | 7/2003 | Watson et al. ................ 355/30 |
| 6,603,130 B1 | 8/2003 | Bisschops et al. .......... 250/492.1 |
| 6,867,844 B2 * | 3/2005 | Vogel et al. ................. 355/30 |
| 7,053,983 B2 * | 5/2006 | Tokita ......................... 355/53 |
| 2002/0020821 A1 | 2/2002 | Van Santen et al. ......... 250/492 |
| 2002/0163629 A1 | 11/2002 | Switkes et al. ................ 355/53 |
| 2003/0123040 A1 | 7/2003 | Almogy ....................... 355/69 |

(Continued)

FOREIGN PATENT DOCUMENTS

DE    206 607    2/1984

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner*—Hung Henry Nguyen
(74) *Attorney, Agent, or Firm*—Pillsbury Winthrop Shaw Pittman, LLP

(57) ABSTRACT

An immersion lithographic apparatus has adaptations to prevent or reduce bubble formation in one or more gaps in the substrate table by preventing bubbles escaping from the gap into the beam path and/or extracting bubbles that may form in the gap.

21 Claims, 5 Drawing Sheets

U.S. PATENT DOCUMENTS

| | | | |
|---|---|---|---|
| 2004/0000627 A1 | 1/2004 | Schuster | 250/201.2 |
| 2004/0075895 A1 | 4/2004 | Lin | 359/380 |
| 2004/0114117 A1 | 6/2004 | Bleeker | 355/53 |
| 2004/0136494 A1 | 7/2004 | Lof et al. | 378/34 |
| 2004/0160582 A1 | 8/2004 | Lof et al. | 355/30 |
| 2004/0165159 A1 | 8/2004 | Lof et al. | 355/30 |
| 2004/0207824 A1 | 10/2004 | Lof et al. | 355/30 |
| 2004/0211920 A1 | 10/2004 | Derksen et al. | 250/492.1 |
| 2004/0239954 A1 | 12/2004 | Bischoff | 356/635 |
| 2004/0257544 A1 | 12/2004 | Vogel et al. | 355/30 |
| 2004/0263809 A1 | 12/2004 | Nakano | 355/30 |
| 2005/0007569 A1 | 1/2005 | Streefkerk et al. | 355/30 |
| 2005/0018155 A1 | 1/2005 | Cox et al. | 355/30 |
| 2005/0024609 A1 | 2/2005 | De Smit et al. | 355/18 |
| 2005/0030497 A1 | 2/2005 | Nakamura | 355/30 |
| 2005/0046813 A1 | 3/2005 | Streefkerk et al. | 355/30 |
| 2005/0046934 A1 | 3/2005 | Ho et al. | 359/380 |
| 2005/0052632 A1 | 3/2005 | Miyajima | 355/53 |
| 2005/0094116 A1 | 5/2005 | Flagello et al. | 355/53 |
| 2005/0094125 A1 | 5/2005 | Arai | 355/72 |
| 2005/0122505 A1 | 6/2005 | Miyajima | 355/72 |
| 2005/0132914 A1 | 6/2005 | Mulkens et al. | 101/463.1 |
| 2005/0134817 A1 | 6/2005 | Nakamura | 355/53 |
| 2005/0140948 A1 | 6/2005 | Tokita | 355/30 |
| 2005/0146693 A1 | 7/2005 | Ohsaki | 355/30 |
| 2005/0146694 A1 | 7/2005 | Tokita | 355/30 |
| 2005/0151942 A1 | 7/2005 | Kawashima | 355/30 |
| 2005/0175776 A1 | 8/2005 | Streefkerk et al. | 427/256 |
| 2005/0175940 A1 | 8/2005 | Dierichs | 430/322 |
| 2005/0200815 A1 | 9/2005 | Akamatsu | 353/53 |
| 2005/0213065 A1 | 9/2005 | Kitaoka | 355/53 |
| 2005/0213066 A1 | 9/2005 | Sumiyoshi | 355/53 |
| 2005/0219489 A1 | 10/2005 | Nei et al. | 355/53 |
| 2005/0225734 A1 | 10/2005 | De Smit et al. | 355/30 |
| 2005/0233081 A1 | 10/2005 | Tokita | 427/256 |
| 2006/0038968 A1* | 2/2006 | Kemper et al. | 355/18 |
| 2006/0087630 A1* | 4/2006 | Kemper et al. | 355/30 |

FOREIGN PATENT DOCUMENTS

| | | |
|---|---|---|
| DE | 221 563 | 4/1985 |
| DE | 224 448 | 7/1985 |
| DE | 242 880 | 2/1987 |
| EP | 0023231 | 2/1981 |
| EP | 0418427 | 3/1991 |
| EP | 1039511 | 9/2000 |
| EP | 1 628 163 A2 | 2/2006 |
| EP | 1 788 617 A1 | 5/2007 |
| EP | 1 801 850 A1 | 6/2007 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| WO | WO 99/49504 | 9/1999 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2005/010611 | 2/2005 |
| WO | WO 2005/024517 | 3/2005 |
| WO | WO 2005/048328 A1 | 5/2005 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithgraphy: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths To Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future Fab International, vol. 15, Jul. 11, 2003.

H. Kawata et al., "Fabrication of 0.2 μm Fine Patterns Using Optical Projection Lithography with an Oil Immersion Lens", Jpn. J. Appl. Phys. vol. 31 (1992), pp. 4174-4177.

G. Owen et al., "1/8 μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $\kappa_3$ coefficient in nonparaxial $\lambda$/NA scaling equations for resolution, depth of focus, and immersion lithography, *J. Microlith., Microfab., Microsys*. 1(1):7-12 (2002).

European Office Action issued for European Patent Application No. 06252309.7—1226, dated Aug. 21, 2007.

* cited by examiner

LITHOGRAPHIC APPARATUS AND DEVICE MANUFACTURING METHOD

FIELD

The invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as enabling the use of a larger effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

SUMMARY

A significant cause of defects in devices manufactured using immersion lithographic apparatus can be bubbles in the immersion liquid, which can cause dose variations and image distortions, depending on the size and location of the bubble. It is therefore highly desirable to prevent bubbles entering the path of the projection beam. Major sources of bubbles can be gaps in the smooth top surface of the substrate table (mirror block), for example around sensor units, fiducial plates and the substrate. As such gaps pass the liquid supply system (liquid confinement structure) they may not fill completely and the gas left behind may form bubbles. Those bubbles may then rise out of the gap and into the space between the projection system and the substrate.

Accordingly, it would be advantageous, for example, to provide one or more arrangements for preventing bubbles formed in a gap in the top surface of the substrate table from causing imaging defects in the production of devices.

According to an aspect of the invention, there is provided a lithographic apparatus configured to project an image of a desired pattern through a liquid onto a substrate held on a substrate table, there being a gap in a surface of the substrate table or between the substrate table and another component mounted thereon with which the liquid can, in normal use, come into contact, the gap provided with a bubble retaining device configured to retain any bubbles that might occur therein.

According to a further aspect of the invention, there is provided a lithographic apparatus configured to project an image of a desired pattern through a liquid onto a substrate held on a substrate table, there being a gap in a surface of the substrate table or between the substrate table and another component mounted thereon with which the liquid can, in normal use, come into contact, the gap being divided along its length into a plurality of segments.

According to a further aspect of the invention, there is provided a lithographic apparatus configured to project an image of a desired pattern through a liquid onto a substrate held on a substrate table, there being a gap in a surface of the substrate table or between the substrate table and another component mounted thereon with which the liquid can, in normal use, come into contact, the apparatus comprising a device configured to extract liquid, gas or both from the gap.

According to a further aspect of the invention, there is provided a lithographic apparatus configured to project an image of a desired pattern through a liquid onto a substrate held on a substrate table, there being a gap in a surface of the substrate table or between the substrate table and another component mounted thereon with which the liquid can, in normal use, come into contact, the apparatus comprising a device configured to supply liquid to the gap.

According to a further aspect of the invention, there is provided a device manufacturing method in which an image of a desired pattern is projected through a liquid onto a substrate held on a substrate table, there being a gap in a surface of the substrate table or between the substrate table and another component mounted thereon with which the liquid can, in normal use, come into contact, comprising extracting liquid, gas, or both from the gap and bubbles in the gap are retained therein by a bubble retaining device.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
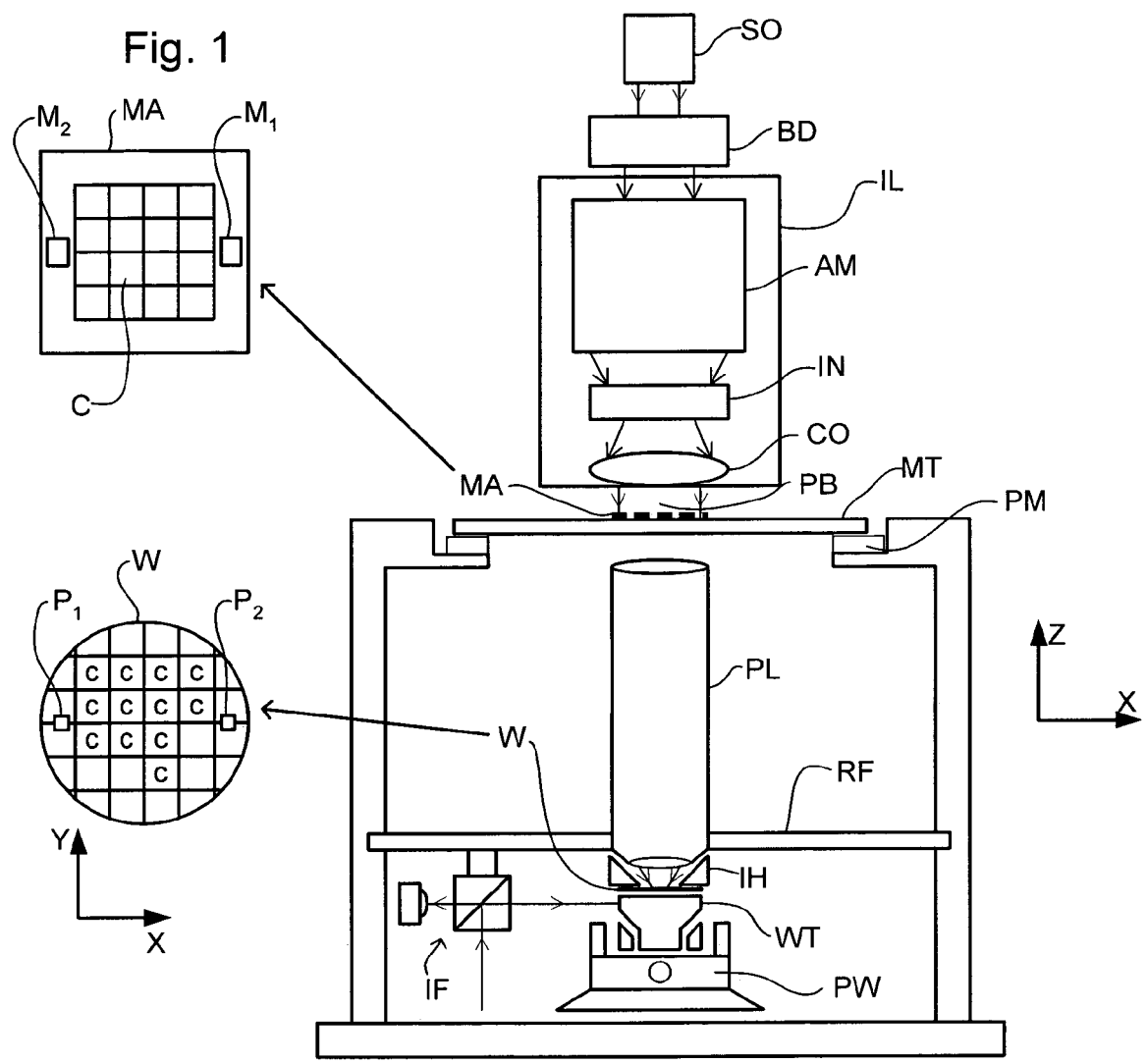
FIG. 1 depicts a lithographic apparatus according to an embodiment of the invention.
Figure 2:
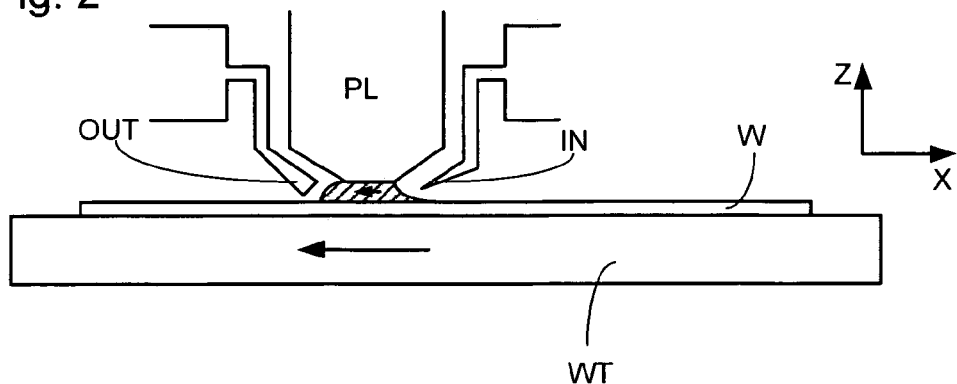
FIGS. 2 and 3 depict a liquid supply system for use in a lithographic projection apparatus.
Figure 3:
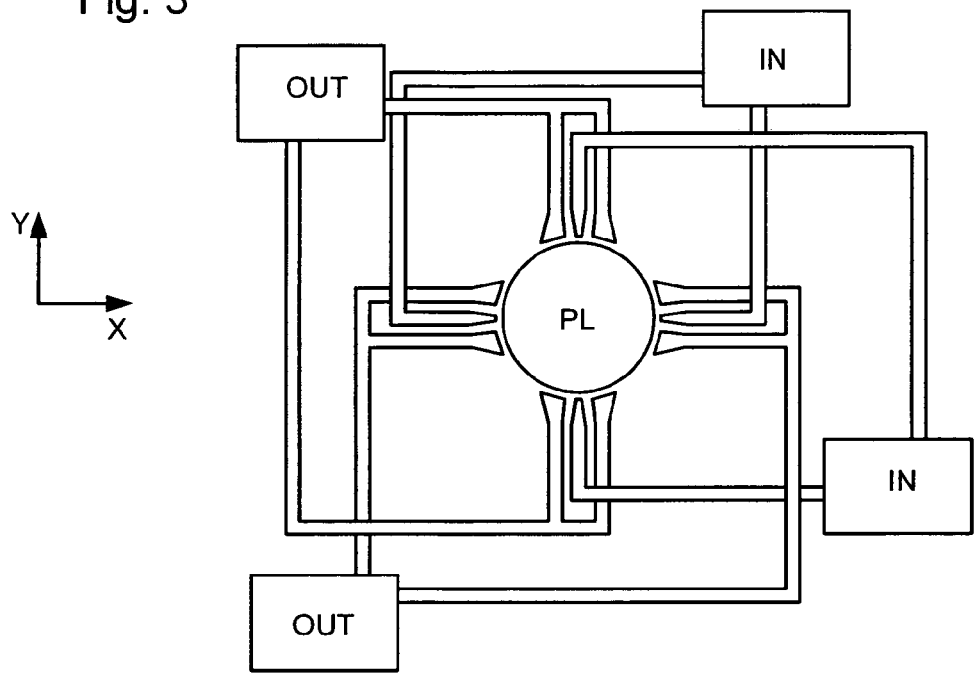

FIG. 1 schematically depicts a lithographic apparatus according to one embodiment of the invention. The apparatus comprises:

an illumination system (illuminator) IL configured to condition a radiation beam PB (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam PB is incident on the patterning device (e.g., mask MA), which is held on the support structure (e.g., mask table MT), and is patterned by the patterning device. Having traversed the mask MA, the radiation beam PB passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam PB. Similarly, the first positioner PM and another position sensor (which is not explicitly depicted in FIG. 1) can be used to accurately position the mask MA with respect to the path of the radiation beam PB, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4:
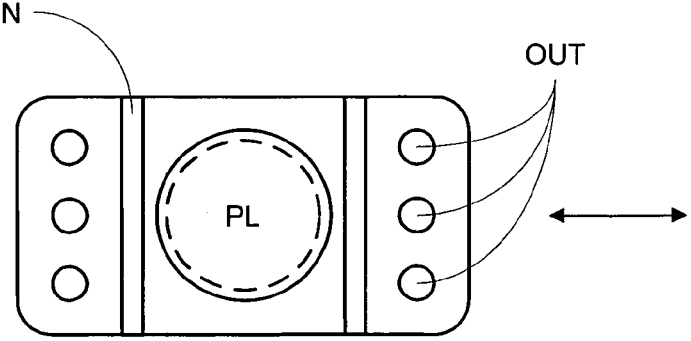
FIG. 4 depicts another liquid supply system for use in a lithographic projection apparatus.
Figure 4:
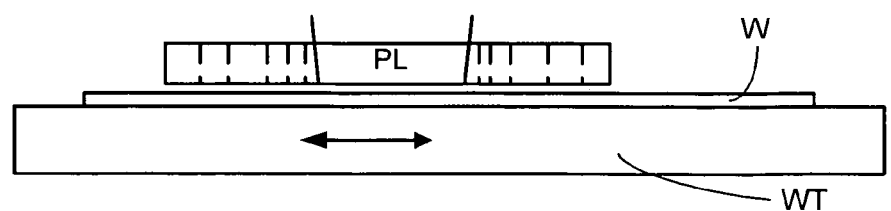

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
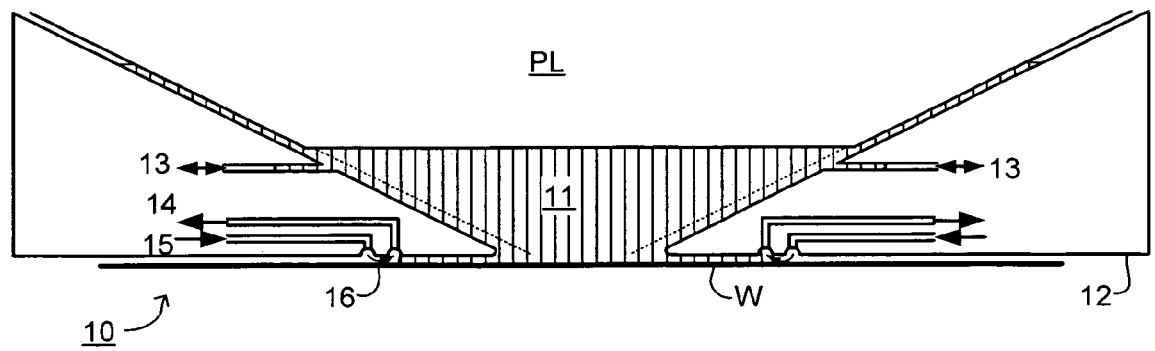
FIG. 5 depicts a further liquid supply system for use in a lithographic projection apparatus.

Another immersion lithography solution with a localized liquid supply system solution which has been proposed is to provide the liquid supply system with a liquid confinement structure which extends along at least a part of a boundary of the space between the final element of the projection system and the substrate table. Such a solution is illustrated in FIG. 5. The liquid confinement structure is substantially stationary relative to the projection system in the XY plane though there may be some relative movement in the Z direction (in the direction of the optical axis). In an embodiment, a seal is formed between the liquid confinement structure and the surface of the substrate. In an embodiment, the seal is a contactless seal such as a gas seal. Such a system is disclosed in United States patent application publication no. 2004-0207824 and European patent application publication no. EP 1420298, each hereby incorporated in its entirety by reference, and illustrated in FIG. 5.

As shown in FIG. 5, a liquid supply system is used to supply liquid to the space between the projection system and the substrate. The reservoir 10 forms a contactless seal to the substrate around the image field of the projection system so that liquid is confined to fill a space between the substrate surface and a final element of the projection system. The reservoir is formed by a liquid confinement structure 12 positioned below and surrounding the final element of the projection system PL. Liquid is brought into the space below the projection system via the inlet 13 and within the liquid confinement structure 12. The liquid confinement structure 12 extends a little above the final element of the projection system and the liquid level rises above the final element so that a buffer of liquid is provided. The liquid confinement structure 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the liquid confinement structure 12 and the surface of the substrate W. The gas seal is formed by gas, e.g. air, synthetic air, $N_2$ or an inert gas, provided under pressure via inlet 15 to the gap between liquid confinement structure 12 and substrate and extracted via first outlet 14. The overpressure on the gas inlet 15, vacuum level on the first outlet 14 and geometry of the gap are arranged so that there is a high-velocity gas flow inwards that confines the liquid.

In a lithographic apparatus, the substrate W is commonly placed upon a substrate holder, also referred to as a pimple plate or burl table, which sits in a recess, often referred to as a pot hole, in the upper surface of the substrate table WT. To accommodate variations in the size and placement of the substrate W within certain tolerances, the recess is slightly larger than the substrate. Thus, although the recess, substrate holder and substrate have dimensions selected to ensure the upper surface of the substrate is substantially co-planar with the upper surface of the substrate table, a gap will remain around the edges of the substrate. Similarly, certain sensors and fiducials (reference markers) that are found on the substrate table are mounted on plates or in blocks that are set into corresponding recesses in the substrate table. Again the recesses are slightly oversize to accommodate variations in the size of the blocks or plates and to enable the sensors to be removed for servicing or upgrading, leading to gaps.

Such gaps may be a significant source of bubbles that may enter the beam path and affect imaging. The speed of the substrate table when it is moved so that the gaps pass under the projection system and the space filled with immersion liquid is such that there is often insufficient time for the gaps to completely fill with immersion fluid. Gas that remains in the gap forms bubbles that can leave the gap and float up into the path of the projection beam. There, they can cause imaging defects such as dose variation and image distortion.

Figure 6:
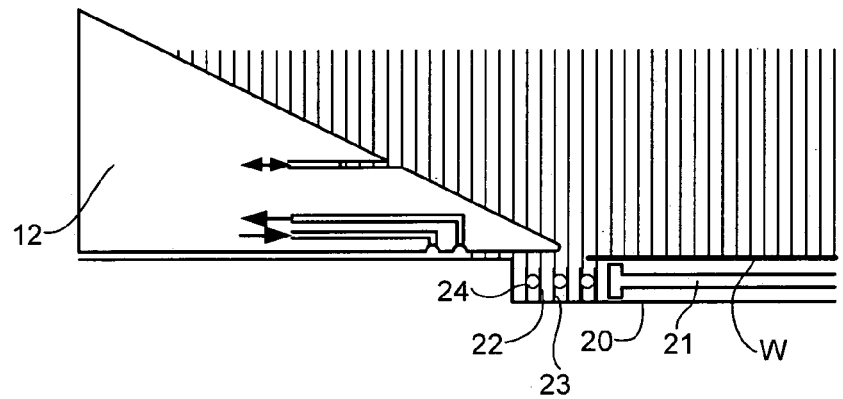
FIG. 6 depicts a gap between the substrate table and the substrate according to an embodiment of the invention.

FIG. 6 shows a gap between the substrate table and the substrate according to an embodiment of the invention. The gap 22 between the substrate holder 21 and the recess 20 in which the substrate W and substrate holder 21 sit, is provided with a number of hairs 23 which act as a device to retain bubbles in the gap. The hairs 23 are hydrophobic (i.e. have a contact angle of greater than 90° to the immersion liquid, the contact angle being the angle between the solid-liquid interface and the liquid-gas interface) and act to trap any bubbles 24 that may form in the gap. The bubbles do no harm when retained in the gap; it is only if they break free and float into the beam path that imaging defects may be caused.

FIGS. 7 to 14 depict arrangements according to other embodiments of the invention. In the following embodiments, parts that are equivalent to parts shown FIG. 6 are identified by like reference numerals and a detailed description is omitted for conciseness. It will of course be appreciated that features of different embodiments can be combined. Arrangements shown applied to the gap around a substrate may of course equally be applied to the gap around a sensor block or a fiducial plate and indeed any other gap (including a groove) that there may be on the upper surface of the substrate table.

Figure 7:
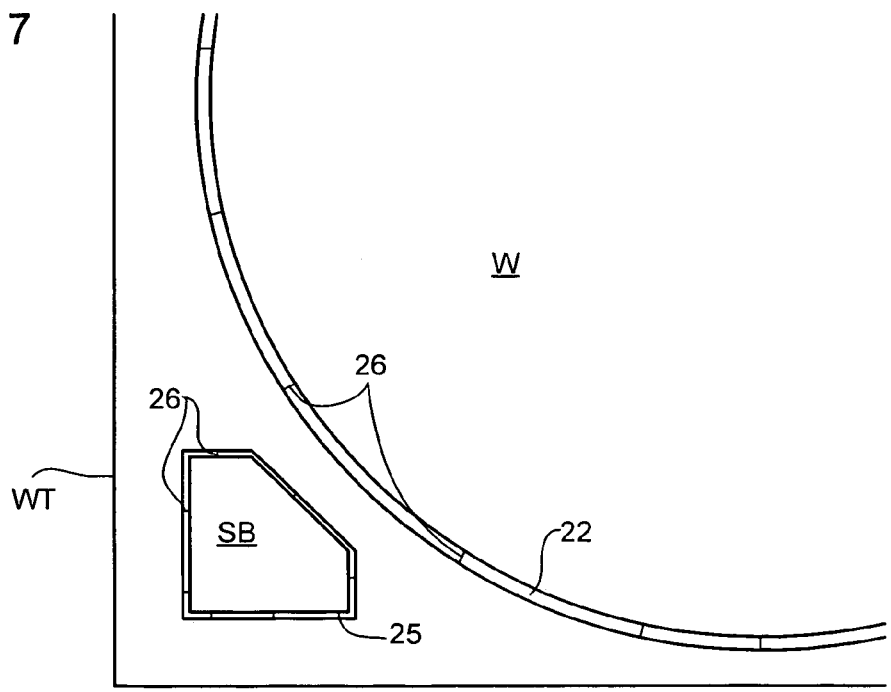
FIG. 7 depicts a gap between the substrate table and the substrate according to another embodiment of the invention.

In the embodiment of FIG. 7, the gap 22 around the edge of the substrate W and the gap 25 around the edge of a sensor block SB are segmented by transverse walls 26 at convenient positions. When the gaps pass under the liquid confinement system, liquid flows into the gaps but only fills the segment or segments of the gap that are partly under the projection system. Being smaller, these can be filled more quickly and completely, reducing or avoiding the formation of bubbles.

Figure 8:
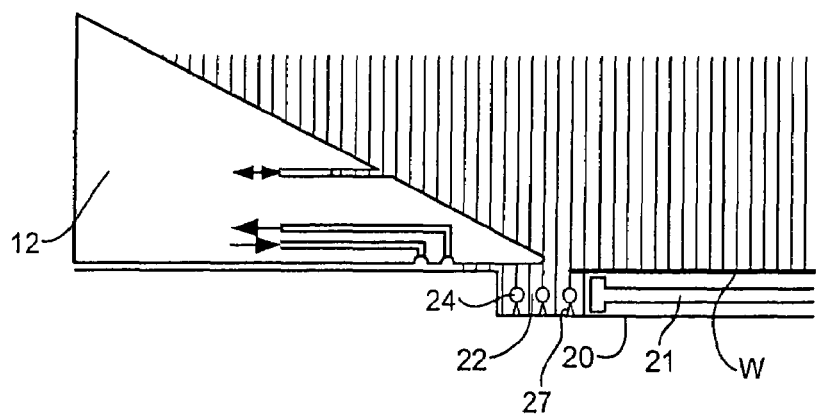
FIG. 8 depicts a gap between the substrate table and the substrate according to another embodiment of the invention.

FIG. 8 shows an alternative device for retaining bubbles in the gap. As shown, one or more sharp edges 27 are provided in the gap 22. Any bubbles 24 will be preferentially attached to the sharp edge or edges which effectively increase the contact angle and should not break free to enter the beam path.

Figure 9:
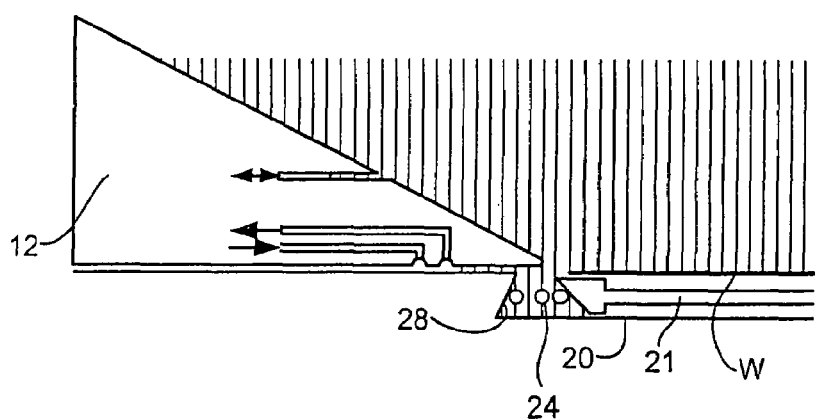
FIG. 9 depicts a gap between the substrate table and the substrate according to another embodiment of the invention.

A further device to retain bubbles is shown in FIG. 9. This comprises one or more overhanging walls 28 to the gap 22 so that it tapers inwardly and upwardly, trapping bubbles in the gap.

Figure 10:
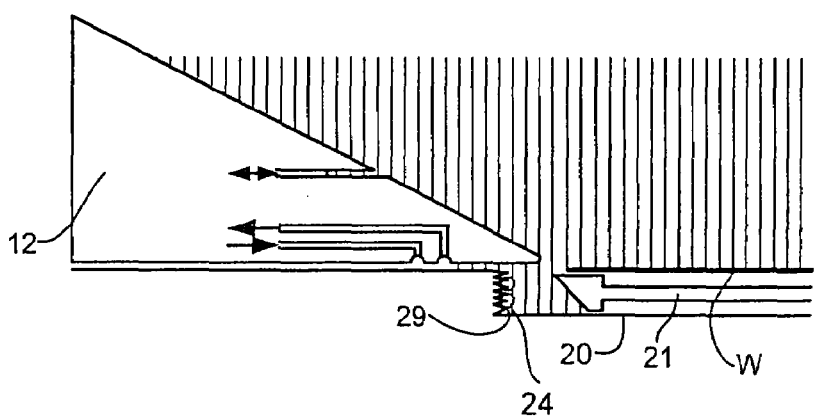
FIG. 10 depicts a gap between the substrate table and the substrate according to another embodiment of the invention.

In the embodiment of FIG. 10, a rough coating 29 is provided on one or more suitable surfaces of the gap. The rough coating has changes of surface gradient on the same scale as bubbles and thus locally increases the contact angle making the surface hydrophobic even if the material of the coating is intrinsically hydrophilic. This again acts to retain bubbles in the gap 22.

Figure 11:
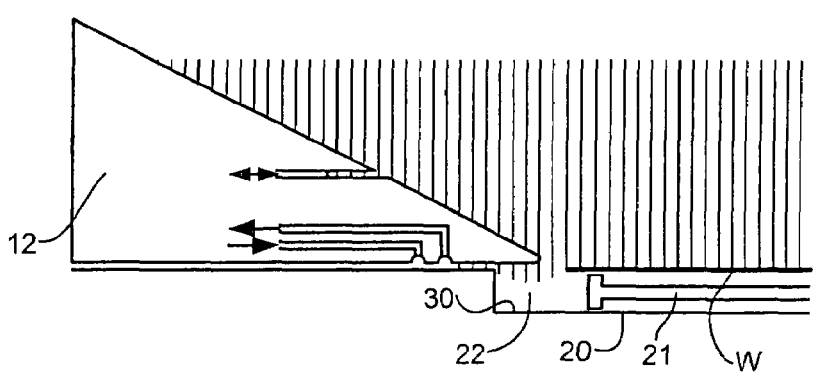
FIG. 11 depicts a gap between the substrate table and the substrate according to another embodiment of the invention.

In the arrangement shown in FIG. 11, the coating 30, which need not be rough, is sufficiently hydrophobic to prevent immersion liquid 11 entering the gap at all.

Figure 12:
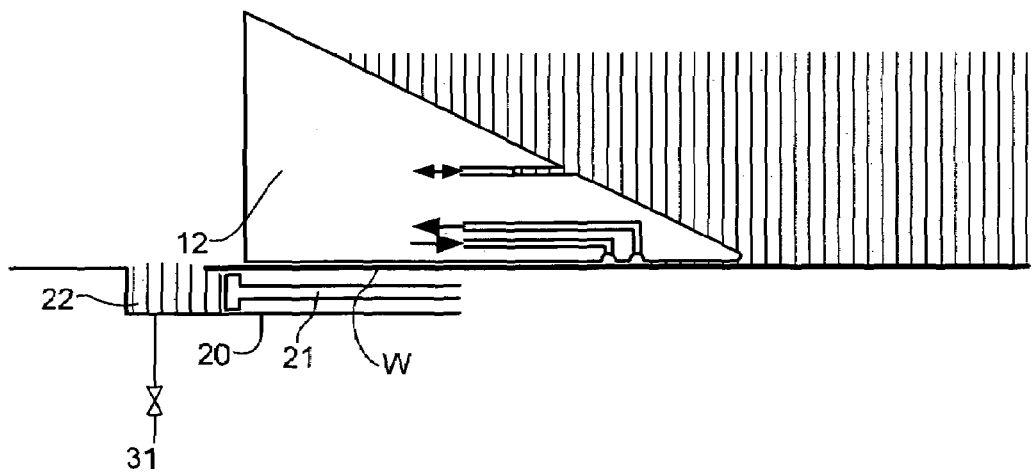
FIG. 12 depicts a gap between the substrate table and the substrate according to another embodiment of the invention.

Another approach is shown in FIG. 12. This embodiment comprises a liquid supply 31 that is controlled to supply liquid to the gap 22 in advance of it moving under the projection system so that the gap is in effect pre-filled. The filling can be completed in sufficient time to ensure that no or little gas remains and so there are no or few bubbles that might enter the beam path. The liquid that fills the gap is, in an embodiment, the immersion liquid but another liquid may be used instead, such as a denser liquid that is immiscible with the immersion liquid. To avoid the liquid being blown out of the gap, any gas knife or gas bearing in the liquid confinement system should be reduced or switched-off, at least locally, as the gap passes under the edge of the liquid confinement system.

Figure 13:
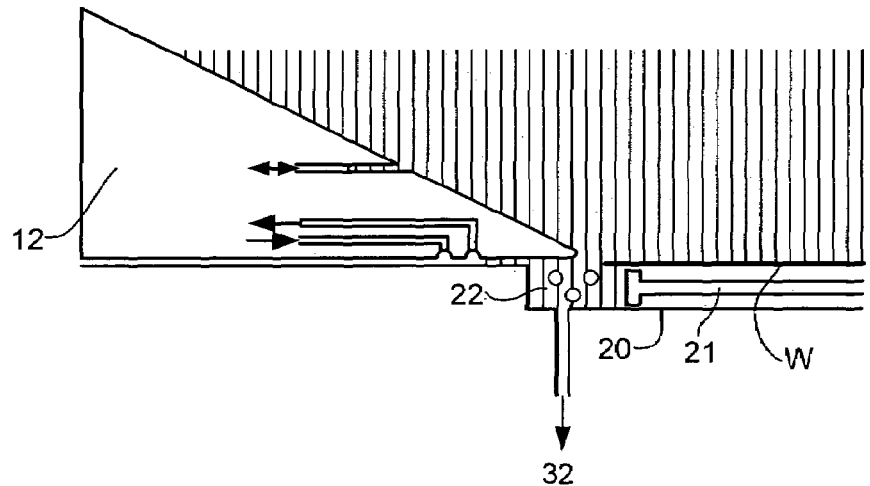
FIG. 13 depicts a gap between the substrate table and the substrate according to another embodiment of the invention.

FIG. 13 shows a further solution to the problem of bubbles in the gap. Here a liquid and gas extractor 32 is used to ensure a flow that sweeps up any bubbles 24 that may be in gap 22 and removes them before they can float up to the beam path. A gas-permeable but liquid-impermeable membrane can be used across the extractor 32 so that only gas is removed, reducing the consumption of immersion liquid.

Figure 14:
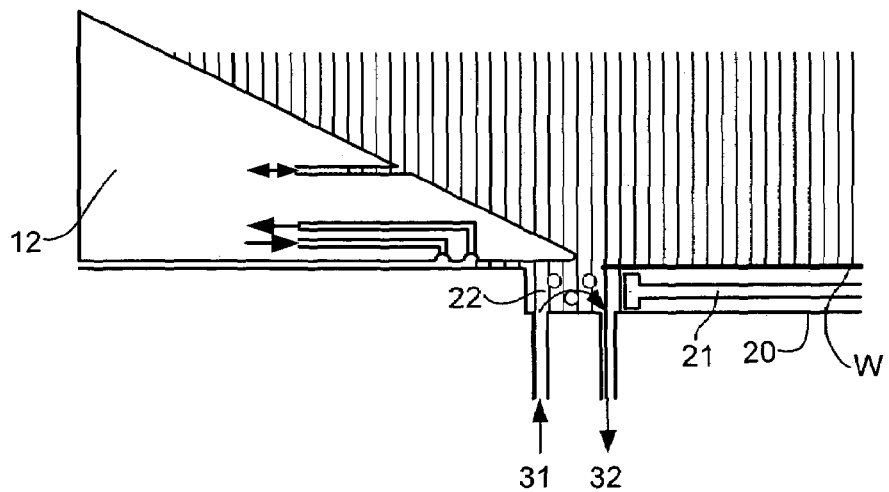
FIG. 14 depicts a gap between the substrate table and the substrate according to another embodiment of the invention.

FIG. 14 shows the combination of a liquid supply 31 and extractor 32 to set up a horizontal flow that entrains and removes bubbles. In this approach, the surfaces of the gap may be hydrophilic to encourage bubble release.

Although water-related terms such as hydrophilic, hydrophobic, humidity, etc. maybe used herein, these terms should be understood to encompass the similar properties for other liquids.

In European patent application publication no. EP 1420300 and U.S. patent application publication Ser. No. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 m).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus for projecting an image of a desired pattern through an immersion liquid onto a substrate held on a substrate table, there being a groove in a surface of the substrate table or a gap between the substrate table and another component mounted thereon with which the immersion liquid can in normal use come into contact, wherein the gap or groove is provided with a bubble retaining device adapted and configured to retain any bubbles that might form therein.

2. A lithographic apparatus according to claim 1, wherein the bubble retaining device comprises a plurality of hairs having a contact angle to the immersion liquid higher than 90.

3. A lithographic apparatus according to claim 1, wherein the bubble retaining device comprises one or more sharp edges.

4. A lithographic apparatus according to claim 1, wherein the bubble retaining device comprises a tapering of the gap or groove away from a center portion of the gap or groove.

5. A lithographic apparatus according to claim 1, wherein the bubble retaining device comprises a coating having a contact angle to the immersion liquid higher than 90°.

6. A lithographic apparatus according to claim 5, wherein the coating is rough, to increase the effective contact angle.

7. A lithographic apparatus according to claim 1, wherein the component comprises a substrate.

8. A lithographic apparatus according to claim 1, wherein the component comprises a sensor.

9. A lithographic apparatus according to claim 1, comprising a device configured to extract liquid and/or gas from the gap or groove.

10. A lithographic apparatus according to claim 9, wherein the device configured to extract liquid and/or gas comprises a membrane configured to allow gas but not liquid to be extracted from the gap or groove.

11. A lithographic apparatus according to claim 9, wherein the device configured to extract liquid and/or gas further comprises a device configured to supply immersion liquid to the gap or groove.

12. A lithographic apparatus according to claim 1, wherein the gap or groove is divided along its length into a plurality of segments.

13. A device manufacturing method in which an image of a desired pattern is projected through an immersion liquid onto a substrate held on a substrate table, there being a groove in a surface of the substrate table or a gap between the substrate table and another component mounted thereon with which the immersion liquid can in normal use come into contact, the apparatus comprising a device for extracting liquid and/or gas from the gap or groove, wherein the gap or groove is provided with a bubble retaining device adapted and configured to retain any bubbles that might form therein.

14. The method according to claim 13, wherein the bubble retaining device comprises a plurality of hairs having a contact angle to the liquid higher than 90°.

15. The method according to claim 13, wherein the bubble retaining device comprises one or more sharp edges.

16. The method according to claim 13, wherein the bubble retaining device comprises a tapering of the gap away from a center portion of the gap.

17. The method according to claim 13, wherein the bubble retaining device comprises a coating having a contact angle to the liquid higher than 90°.

18. The method according to claim 17, wherein the coating is rough to increase the effective contact angle.

19. A device manufacturing method according to claim 13, wherein the component comprises a substrate.

20. A device manufacturing method according to claim 13, wherein the component comprises a sensor.

21. A lithographic apparatus for projecting an image of a desired pattern through an immersion liquid onto a substrate held on a substrate table, there being a groove in a surface of the substrate table or a gap between the substrate table and another component mounted thereon with which the immersion liquid can in normal use come into contact, wherein the gap or groove is provided with a bubble retaining device adapted and configured to retain any bubbles that might form therein and the gap or groove comprises an outlet connected to a device configured to supply immersion liquid to the gap or groove.

* * * * *